United States Patent
Sterzbach (10) Patent No.: US 11,674,978 B2
(45) Date of Patent: Jun. 13, 2023

(54) MEASUREMENT SYSTEM AND METHOD FOR OPERATING A MEASUREMENT SYSTEM

(71) Applicant: Rohde & Schwarz GmbH & Co. KG, Munich (DE)

(72) Inventor: Bernhard Sterzbach, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/864,700

(22) Filed: May 1, 2020

(65) Prior Publication Data
US 2021/0341517 A1    Nov. 4, 2021

(51) Int. Cl.
*G01R 1/067* (2006.01)
*G06T 7/70* (2017.01)

(52) U.S. Cl.
CPC .......... *G01R 1/06794* (2013.01); *G06T 7/70* (2017.01)

(58) Field of Classification Search
CPC .. G01R 1/06794; G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/0739; G06T 7/70
See application file for complete search history.

(56) References Cited

U.S. PATENT DOCUMENTS

| | | | | |
|---|---|---|---|---|
| 5,644,245 A | * | 7/1997 | Saitoh | G01R 1/06794 324/750.18 |
| 6,701,003 B1 | * | 3/2004 | Feinstein | G06V 30/422 382/199 |
| 2007/0159194 A1 | * | 7/2007 | Hasegawa | G01R 31/2889 324/750.19 |
| 2015/0362552 A1 | * | 12/2015 | Ozawa | G01R 1/07307 324/750.23 |
| 2016/0116503 A1 | * | 4/2016 | Kiyokawa | G01R 31/2887 324/750.24 |
| 2021/0263074 A1 | * | 8/2021 | Rinder | G01R 1/06788 |

* cited by examiner

*Primary Examiner* — Lee E Rodak
(74) *Attorney, Agent, or Firm* — Christensen O'Connor Johnson Kindness PLLC (57) ABSTRACT

A measurement system is described. The measurement system comprises a measurement device and a probe unit, wherein the measurement device comprises an image analysis circuit or module. The probe unit comprises at least one image sensor, wherein the at least one image sensor is connected to the image analysis module in a signal transmitting manner. The image sensor is configured to capture an image of a measurement area being associated with a device under test. The image analysis module is configured to analyze the image captured and to determine at least one characteristic quantity of the image captured via an image analysis technique. The image analysis module is further configured to gather an information concerning a test position of the probe unit from the at least one characteristic quantity. Further, a method for operating a measurement system is described.

14 Claims, 4 Drawing Sheets

MEASUREMENT SYSTEM AND METHOD FOR OPERATING A MEASUREMENT SYSTEM

FIELD OF THE DISCLOSURE

Embodiments of the present disclosure generally relate to a measurement system. Embodiments of the present disclosure further relate to a method for operating a measurement system.

BACKGROUND

For certain types of measurements on complex electronic circuits, individual test points of the electronic circuit need to be contacted via the tip of a probe unit, wherein the probe unit is connected to a measurement device. The measurement device then usually generates a test signal that is provided to the device under test or rather to the test point. The probe unit then receives a response of the device under test to the test signal, and the response is analyzed via the measurement device.

In between measurements, the measurement device typically has to be reconfigured manually such that respective operating parameters of the measurement device are adapted to the particular type of test point that is to be contacted next by the probe unit.

This however requires a high level of expertise from the user of the measurement device, as the user needs to know the individual types of test points and the respectively required operating parameters of the measurement device. Further, this is also time consuming since the user has to set the measurement device appropriately.

Thus, there is a need for a measurement system and a method for operating a measurement system that support the user in performing the measurements in an efficient manner.

SUMMARY

Embodiments of the present disclosure provide a measurement system. In an embodiment, the measurement system comprises a measurement device and a probe unit, wherein the measurement device comprises an image analysis circuit or module. The probe unit comprises at least one image sensor, wherein the at least one image sensor is connected to the image analysis module in a signal transmitting manner. The image sensor is configured to capture an image of a measurement area being associated with a device under test. The image analysis module is configured to analyze the image captured and to determine at least one characteristic quantity of the image captured via an image analysis technique. The image analysis module is further configured to gather an information concerning a test position of the probe unit from the at least one characteristic quantity.

Generally, the measurement area is an area in front of the probe unit.

The measurement area may comprise at least one component of a real device under test that is to be tested via the probe unit. Thus, the test position may be at least one actual contact point (also called "test point") of the probe unit, wherein the probe unit needs to contact the at least one actual contact point such that measurements can be performed via the measurement device. In other words, the measurement area is a real measurement area that is associated with the real device under test.

In other words, the actual contact point is the one that is actually contacted by the probe unit. The actual contact point corresponds to a contact point associated with the device under test.

Accordingly, the image analysis module automatically gathers information on the at least one actual contact point of the device under test that is probed via the probe unit. For example, the image analysis module automatically identifies the type of the actual contact point.

The gathered information may be displayed on a display of the measurement device. Alternatively or additionally, the measurement device may be operated at least partially in an automatic manner based on the gathered information. Thus, the user is assisted in performing the measurements on the real device under test, for instance by a wizard displayed on the display.

Alternatively, the measurement area may be a virtual measurement area, e.g. a circuit diagram of a real device under test, for example a component thereof, wherein the circuit diagram may be printed in a manual of the device under test or is provided on a picture. Furthermore, a picture of the device under test may be used for providing the virtual measurement area.

In other words, the probe unit may be positioned over a representation associated with the device under test, such as a circuit diagram of the device under test, a picture of the circuit diagram or a picture of at least a portion of the device under test.

The virtual measurement area may also comprise at least one code such as a serial code, a barcode, and/or a QR code that is printed in the manual and/or shown on the picture, wherein the at least one code is associated with a particular component or rather contact point of the device under test.

Thus, the image analysis module may automatically identify the type of a virtual contact point in the virtual measurement area. Therein, the virtual contact point in the virtual measurement area corresponds to a (real) contact point to be probed of the real device under test.

Information on the virtual contact point may be displayed on a display of the measurement device. This is particularly useful during training of a user, as the user may practice correctly identifying contact points of a real device under test based on the circuit diagram of the device under test and/or based on the picture of the device under test.

In some embodiments, a location of the real contact point corresponding to the virtual contact point may be determined automatically. A representation of the location of the real contact point in the device under test may be displayed on a display of the measurement device. In other words, the test position may be the location of the real contact point.

Thus, the user is assisted in performing the subsequent real measurements by displaying information on the virtual contact point or rather the associated actual contact point, wherein the information is gathered based on an image analysis of the virtual measurement area.

In some embodiments, the image sensor may be part of a camera that is attached to the probe unit or that is integrated into the probe unit.

According to an aspect of the present disclosure, the at least one characteristic quantity comprises at least one of a shape, a geometrical pattern, a color pattern, and an object class. Therein, the terms "shape" and "geometrical pattern" are understood to comprise letters, numbers, serial codes and codes, such as barcodes or QR codes. The term "object class" is understood to comprise at least one type of contact point for the probe unit in the device under test and/or a type of circuitry.

The device under test, or rather an electronic circuitry of the device under test, may comprise printed labels, for example a combination of letters and numbers, wherein the labels are respectively associated with a particular type of contact point. The measurement system according to the disclosure may be configured to automatically identify the at least one contact point based on an image analysis of these labels.

Alternatively or additionally, the at least one characteristic quantity may also comprise particular relevant portions of an image of the device under test.

According to another aspect of the present disclosure, the measurement system further comprises a measurement circuit or module, the measurement module being configured to at least one of adapt at least one measurement parameter of the measurement device and to perform a measurement automatically based on the at least one characteristic quantity determined.

For example, properties of an electrical signal that is provided to the device under test via the probe unit for performing the measurement may be automatically adapted based on the at least one characteristic quantity. Thus, an appropriate test signal is provided for the particular type of contact point of the device under test that is (to be) probed.

In some embodiments, the at least one measurement parameter is adapted (automatically) based on the gathered information concerning the test position.

The at least one characteristic quantity may be compared with information on the device under test, wherein the information on the device under test may be stored in a memory of the device under test. For example, the stored information may comprise images of portions of the device under test, characteristic quantities associated with the respective portions and/or measurement parameters associated with the respective portions.

In other words, the image captured via the at least one image sensor is compared with the known data set. If the respective portion of the device under test has already been tested before, the corresponding measurement parameters are already known, i.e. stored in the memory, and may be set automatically.

It is noted that the determined measurement parameters for a measurement may be equal to the measurement parameters of an immediately antecedent measurement. In this case, the measurement parameters of the measurement device are not adapted. The measurement is then automatically performed with the same measurement parameters as in the antecedent measurement.

In a further embodiment of the present disclosure, the image sensor and the measurement module are configured to capture the image together with at least one measurement value obtained. The captured image, or rather the at least one characteristic quantity associated with the captured image, and the at least one measurement value obtained may be stored in the memory of the measurement device together. Thus, additional information on the respective test point is provided, and the image analysis module may employ this additional information in a future measurement.

Additionally or alternatively, at least one measurement parameter that was used for obtaining the at least one measurement value may be stored in the memory of the measurement device together with the captured image or rather together with the at least one characteristic quantity associated with the captured image.

According to another aspect of the present disclosure, the image analysis module is configured to determine at least one of a location of the probe unit and a position of the probe unit based on the image. Therein, the term "location" is understood to denote the coordinates of the probe unit, for example the coordinates of a tip of the probe unit with respect to a predefined coordinate system. The term "position" is understood to denote both the location and the orientation of the probe unit.

The location and/or the position may be displayed on the display of the measurement device. Thus, the user of the measurement device is provided with additional information that facilitates finding the correct contact points of the device under test.

In some embodiments, the location and/or the position of the probe unit with respect to a device under test is determined.

The at least one measurement parameter may be adapted based on the determined location and/or the determined position. For example, the at least one measurement parameter may be corrected for a misalignment between the probe unit and the test position.

In a further embodiment of the present disclosure, the image analysis module is configured to determine at least one of a location of the probe unit relative to a test point and a position of the probe unit relative to the test point based on the image. Therein, the test point is an actual contact point or a virtual contact point of the device under test.

Alternatively or additionally, a distance of the probe unit to a contact point of the device under test may be determined. Thus, the user of the measurement device is provided with additional information that facilitates finding a particular contact point of the device under test.

In some embodiments, the probe unit comprises a second image sensor, and the distance may be determined based on images of the measurement area captured via both image sensors.

The measurement system may further comprise a memory, wherein a data set comprising information on properties of the device under test is stored in the memory. The information on properties of the device under test may comprise geometrical properties of the device under test, locations of test points in the device under test, possibly together with respective images, characteristic quantities and/or suitable measurement parameters.

The at least one characteristic quantity determined by the image analysis module may be compared with the data set in order to determine the location of the probe unit, the position of the probe unit and/or the type of a particular test point.

Of course, a user may add entries into the data set manually, for example during or after measurements performed with the measurement device, e.g. if the current test point is not automatically recognized by the image analysis module. Moreover, the user may also adapt existing entries.

In a further embodiment of the present disclosure, the data set comprises a three-dimensional model of at least a portion of the device under test. In some embodiments, the data set comprises a complete three-dimensional model of the device under test.

As already described above, the probe unit may have a second image sensor. Based on images captured via the two image sensors, three-dimensional image data may be determined. The three-dimensional image data may then be compared with the three-dimensional model in order to gather the information concerning the test position of the probe unit.

According to an aspect of the present disclosure, the data set comprises a measurement protocol for the device under test. The measurement protocol may comprise information on the individual test positions of the device under test, e.g. their respective location. The measurement protocol may also comprise relevant test criteria for the individual test positions of the device under test, e.g. reference measurement values for measurements at the test positions. The measurement protocol may further comprise a test sequence for the test positions, wherein the test sequence defines the order in which the individual test positions are to be probed.

Of course, individual portions of protocol or the complete protocol may be manually adapted by the user.

The measurement system may further comprise a display, wherein the display is configured to display at least the test position. The display may further be configured to display the location of the probe unit, the position of the probe unit, measurement parameters associated with the test position, and/or the measurement protocol.

Embodiments of the present disclosure further provide a method for operating a measurement system, wherein the measurement system comprises a probe unit and a measurement device with an image analysis circuit or module, and wherein the probe unit comprises at least one image sensor. The method comprises the following steps:

capturing an image of an image of a measurement area being associated with a device under test by the at least one image sensor;

analyzing the image captured by the image analysis module;

determining at least one characteristic quantity of the image captured via an image analysis technique by the image analysis module; and gathering an information concerning a test position of the probe unit from the at least one characteristic quantity by the image analysis module.

In some embodiments, the method for operating a measurement system is a method for operating the measurement system described above.

Regarding the further properties and advantages of the method, reference is made to the explanations given above with respect to the measurement system, which also hold for the method and vice versa.

According to an aspect of the present disclosure, the at least one characteristic quantity is compared with a data set, wherein the data set comprises at least one of information on properties of the device under test and/or at least one characteristic quantity associated with the device under test. In other words, the image captured via the at least one image sensor is compared with the known data set.

For example, the data set may comprise images of portions of the device under test, characteristic quantities associated with the respective portions and/or measurement parameters associated with the respective portions.

According to another aspect of the present disclosure, the at least one characteristic quantity of the image is compared with a three-dimensional model of the device under test. In some embodiments, the data set comprises a complete three-dimensional model of the device under test.

As already described above, the probe unit may have a second image sensor. Based on images captured via the two image sensors, three-dimensional image data may be determined. The three-dimensional image data may then be compared with the three-dimensional model in order to gather the information concerning the test position of the probe unit.

In a further embodiment of the present disclosure, the at least one characteristic quantity comprises at least one of a shape, a geometrical pattern, a color pattern and an object class. Therein, the terms "shape" and "geometrical pattern" are understood to also comprise letters, numbers, serial codes and codes, such as barcodes or QR codes.

The term "object class" is understood to comprise at least one type of contact point for the probe unit in the device under test and/or a type of circuitry.

According to another aspect of the present disclosure, at least one measurement parameter of the measurement device is adapted based on the at least one characteristic quantity. For example, properties of an electrical signal that is provided to the device under test via the probe unit for performing the measurement may be adapted based on the at least one characteristic quantity. Thus, an appropriate test signal is provided for the particular type of contact point of the device under test.

In some embodiments, the at least one measurement parameter is adapted based on the gathered information concerning the test position.

The at least one characteristic quantity may be compared with information on the device under test, wherein the information on the device under test may be stored in a memory of the device under test. For example, the stored information may comprise images of portions of the device under test, characteristic quantities associated with the respective portions and/or measurement parameters associated with the respective portions.

In other words, the image captured via the at least one image sensor is compared with a known database. If the respective portion of the device under test has already been tested before, the corresponding measurement parameters are already known, i.e. stored in the memory, and may be set automatically.

It is noted that the determined measurement parameters for a measurement may be equal to the measurement parameters of an immediately antecedent measurement. In this case, the measurement parameters of the measurement device are not adapted. The measurement is then automatically performed with the same measurement parameters as in the antecedent measurement.

At least one of a location of the probe unit and a position of the probe unit may be determined based on the image. In some embodiments, the location and/or the position of the probe unit with respect to a device under test is determined.

The location and/or the position may be displayed on the display of the measurement device. Thus, the user of the measurement device is provided with additional information that facilitates finding the correct contact points of the device under test.

According to a further embodiment of the present disclosure, at least one of a location of the probe unit relative to a test point and a position of the probe unit relative to the test point is determined based on the image.

In general, the measurement system and/or the method can be used to configure the measurement device appropriately for an expected signal probed by the probe unit due to the image analysis module.

Furthermore, the measurement system and/or the method can be used to identify a contact point (test point) to be probed.

Moreover, the measurement system and/or the method can be used to position the probe unit appropriately, for example the tip, with regard to the contact point, namely the actual one or the one to be probed.

In addition, the measurement system and/or the method can be used to retrieve measurement results that are stored together with the image(s) captured (and settings of the measurement device) in order to enrich a respective database.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
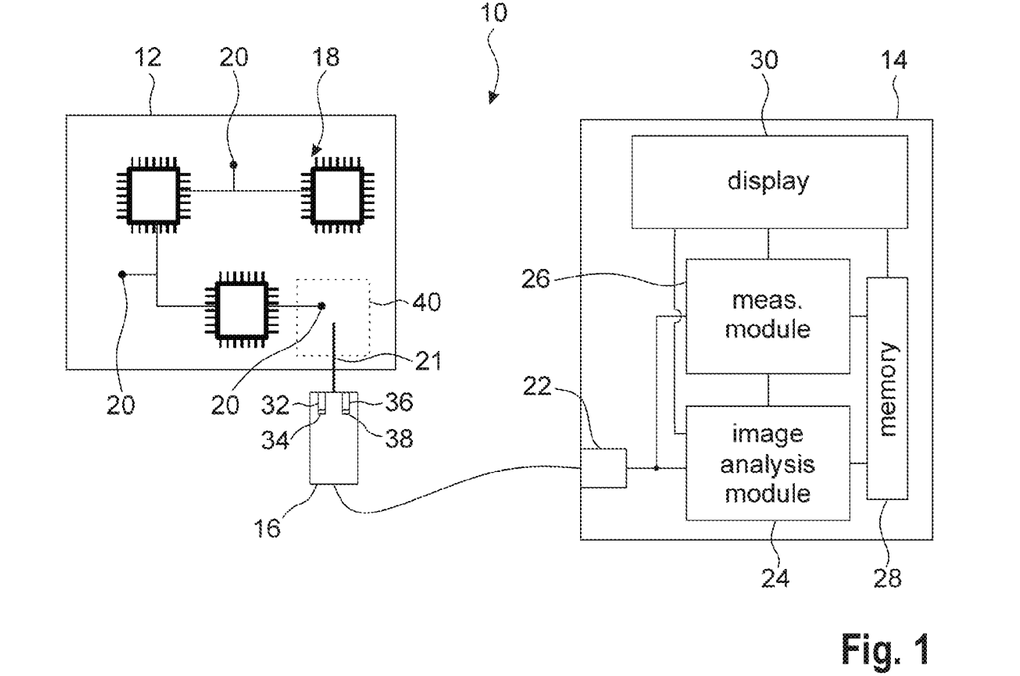
FIG. 1 schematically shows a block diagram of a measurement system according to an embodiment of the disclosure.

FIG. 1 schematically shows a measurement system 10 comprising a device under test 12, a measurement device 14, and a probe unit 16. The device under test 12 comprises at least one electronic circuitry 18 having several contact points 20.

In general, the measurement device 14 is configured to test the electronic circuitry 18 of the device under test 12 via the probe unit 16. In some embodiments, the measurement device 14 may generate an electric test signal that is provided to the device under test 12 or rather to at least one of the contact points 20 via a tip 21 of the probe unit 16. The probe unit 16 then receives a response of the device under test 12 to the electric test signal, and the response is analyzed via the measurement device 14.

Alternatively, the measurement device 14 may simply receive an electric signal from the device under test 12 via the probe unit 16, i.e. without applying a test signal first. Thus, the behavior of the device under test 12 while processing a signal can be evaluated appropriately by the measurement device 14.

It is noted that for certain types of measurements two of the contact points 20 have to be contacted at the same time via two separate probe units. Without restriction of generality, only the case of single contact point measurements is described in the following for the sake of a better legibility.

In some embodiments, the measurement device 14 may be established as an oscilloscope or as a vector network analyzer.

The measurement device 14 comprises a probe interface 22, an image analysis circuit or module 24, a measurement circuit or module 26, a memory 28, and a display 30. As shown in FIG. 1, the measurement device 14 has a housing that encompasses the respective components, namely the image analysis module 24, the measurement module 26 and the memory 28, whereas the display 30 is typically provided at an outer surface of the housing.

In the embodiment shown, the probe unit 16 comprises a first camera 32 with a first image sensor 34 associated with the first camera 32 and a second camera 36 with a second image sensor 38 associated with the second camera 36. The probe unit 16 is connected to the measurement device 14 via the probe interface 22, wherein the probe interface 22 allows for both providing an electric signal to the probe unit 16 and receiving an electric signal from the probe unit 16.

The probe interface 22 is connected to the image analysis module 24 and to the measurement module 26, respectively. The image analysis module 24 and the measurement module 26 are each connected to both of the memory 28 and the display 30. Moreover, the display 30 may also be connected to the memory 28.

In the following, a method for operating the measurement system 10 is described with reference to FIG. 2. The functionality of the individual parts and modules of the measurement system 10 will become apparent from the explanations given below.

At least one image of a measurement area 40 that is associated with the device under test 12 is captured via at least one of the first image sensor 34 and the (optional) second image sensor 38 (step S1). For instance, a respective measurement area 40 is shown in FIG. 1 by dashed lines.

In some embodiments, an image of the measurement area 40 may be captured via both of the first image sensor 34 and the second image sensor 38, respectively. The at least one captured image is forwarded to the image analysis module 24 via the probe interface 22.

The at least one captured image is then analyzed via the image analysis module 24 (step S2). In some embodiments, the image analysis module 24 determines at least one characteristic quantity of the at least one image via an image analysis technique applied on the captured image. The at least one characteristic quantity comprises, for example, at least one of a shape, a geometrical pattern, a color pattern, and an object class. Therein, the terms "shape" and "geometrical pattern" are understood to also comprise letters, numbers, serial codes and codes, such as barcodes or QR codes.

The term "object class" is understood to comprise at least one type of contact point 20 for the probe unit 16 in the device under test 12 and/or a type of circuitry.

The device under test 12, or rather the electronic circuitry 18 of the device under test 12, may comprise printed labels, for example a combination of letters and numbers, wherein the labels are respectively associated with a particular type of contact point. The image analysis module 24 may be configured to automatically identify these labels via the image analysis technique.

Any suitable image analysis technique known may be employed by the image analysis module 24. For example, the image analysis module 24 may comprise an artificial neural network that is configured to perform the image analysis, for example a convolutional neural network (CNN).

Figure 3A:
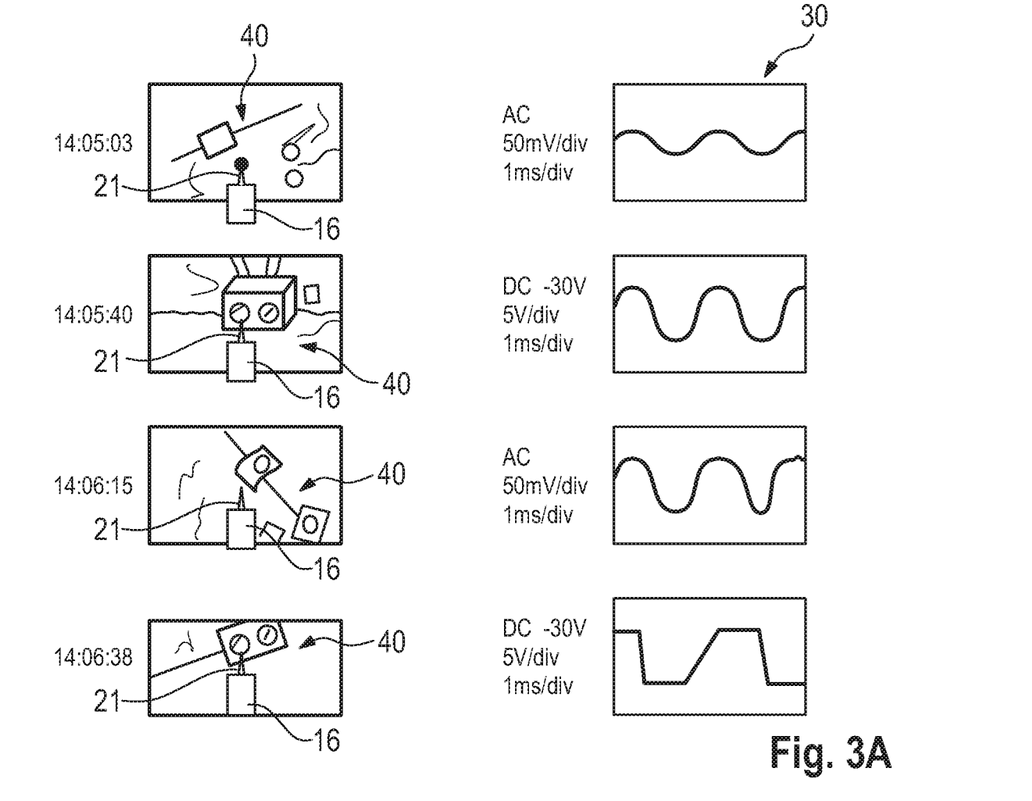
FIGS. 3A-3D each show an overview of a respective operational scenario of the measurement system.

As shown in FIG. 3A, a respective measurement may be performed by the measurement module 26 in order to gather measurement results. The measurement results gathered (and appropriate settings of the measurement device 14) as well as information gathered concerning the image captured by the image analysis module 24 may be stored in the memory 28, for example with a respective time stamp. The information gathered may relate to the position and/or location of the respective probe unit 16 with respect to the measurement area 40.

A respective measurement protocol concerning the measurements performed can be generated and optionally stored in the memory 28. The measurement protocol comprises information concerning the actual contact point (test position) and the measurement results obtained and, optionally the settings of the measurement device 14 such as measurement parameters used during the respective measurements.

Furthermore, the image analysis module 24 can compare the at least one determined characteristic quantity with a data set that is stored in the memory 28 (step S3). For instance, this is schematically shown in FIG. 3B.

By comparing the at least one determined characteristic quantity with the data set, the image analysis module 24 gathers information concerning a test position of the probe unit 16.

Generally speaking, the data set comprises information on properties of the device under test 12 and/or information on properties of the contact points 20. In some embodiments, the data set may comprise information on geometrical properties of the device under test 12, for example information on locations of the contact points 20 in the device under test 12. Moreover, the data set may comprise images of portions of the device under test 12 where at least one of the contact points 20 is located, and/or characteristic quantities associated with these images.

The data set may further comprise a three-dimensional model of at least a portion of the device under test 12. In some embodiments, the data set comprises a complete three-dimensional model of the device under test 12.

In this case, the images captured via the two image sensors 34, 38 may be used by the image analysis module 24 in order to determine three-dimensional image data of the measurement area 40. The three-dimensional image data may then be compared with the three-dimensional model in order to gather the information concerning the test position of the probe unit 16.

Even if the view of the probe unit 16 is different to the stored information, the image analysis module 24 is enabled to compare the respective information due to the three-dimensional model provided.

The data set may also comprise suitable measurement parameters for the measurement device 14, wherein at least one measurement parameter or a set of measurement parameters in the data set may be associated with each of the contact points 20, respectively.

In the particular example of FIG. 1, the test position is the location of the contact point 20 in the measurement area 40. In other words, the test position is the location to which the tip 21 of the probe unit 16 has to be moved in order to perform a measurement on the device under test 12.

Additionally, a location and/or an orientation of the probe unit 16 relative to the test position, i.e. relative to the respective contact point 20, may be determined by the image analysis module 24 based on the at least one image, for example based on the images from both image sensors 34, 38. In other words, a distance of the probe unit 16 from the contact point 20 in the measurement area 40 may be determined by the image analysis module 24.

The determined location, orientation and/or distance may be employed in order to verify whether the probe unit 16 is in the correct position for performing a measurement on the contact point 20.

The current location, orientation and/or distance may be displayed on the display 30, such that the user can move the probe unit 16 until the correct test position is reached. Moreover, information on the device under test 12 and/or on the particular contact point 20 in the measurement area may be displayed on the display 30, e.g. information on the type of the contact point 20.

Figure 2:
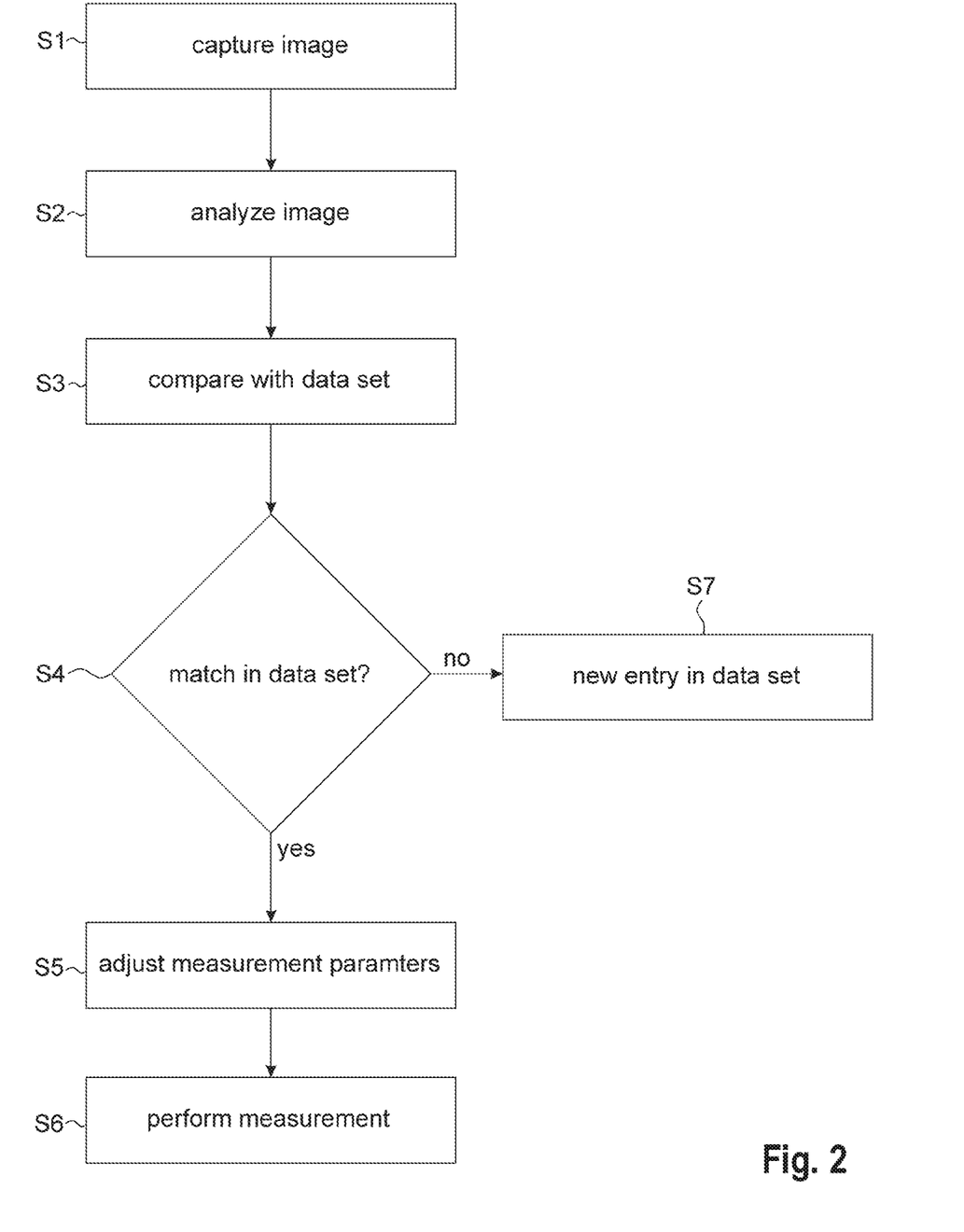
FIG. 2 shows a flow chart of a method for operating the measurement system of FIG. 1 according to an embodiment of the disclosure.
Figure 3B:
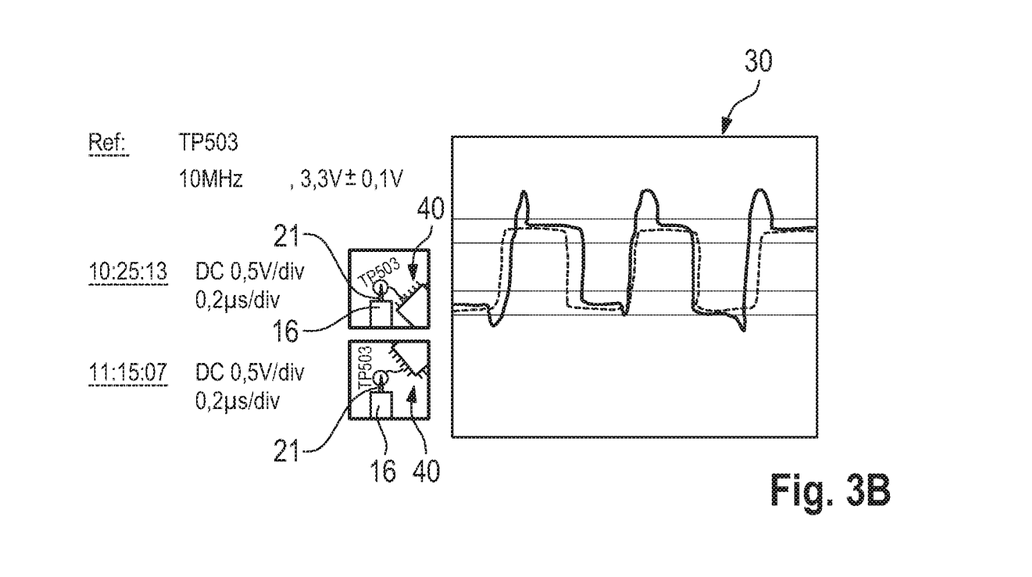

As is indicated at step S4 in FIG. 2, there are two possible outcomes of the comparison of the at least one determined characteristic quantity with the data set. For example, there may be a match in the data set or there may be no match in the data set.

If there is a match in the data set, the at least one measurement parameter associated with the respective contact point 20 is loaded from the memory 28 into the measurement module 26 (step S5). In other words, at least one measurement parameter of the measurement device 14 is automatically adapted based on the comparison of the at least one characteristic quantity with the data set.

It is noted that the measurement parameters loaded from the memory 28 may be equal to the measurement parameters of an immediately antecedent measurement. In this case, the measurement parameters of the measurement device 14 are not adapted but rather kept as in the antecedent measurement.

The measurement module 26 then automatically performs a measurement on the device under test 12, more precisely on the contact point 20 that is contacted by the tip 21 of the probe unit 16 based on the at least one measurement parameter loaded from the memory 28 (step S6).

Additional information regarding this particular measurement may be displayed on the display 30. For example, reference measurement values for that particular contact point 20 may be displayed, such that the user can immediately compare an obtained measurement value with the reference measurement value. This is also shown in FIG. 3B.

Moreover, tolerance values for that particular measurement may be displayed on the display 30.

Figure 3C:
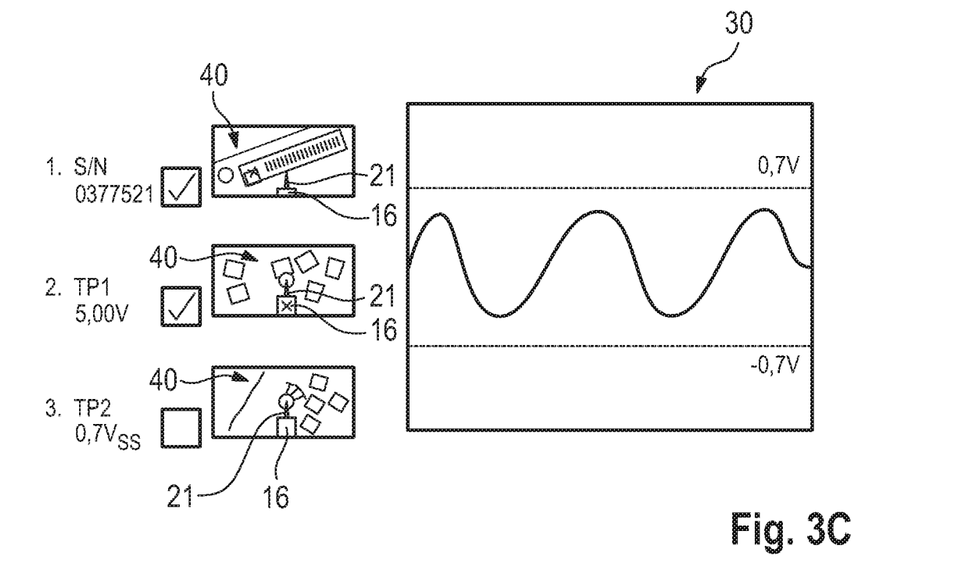

Optionally, the data set stored in the memory may further comprise a measurement protocol for the device under test 12, and the measurement protocol may be displayed on the display 30. For instance, this is shown in FIG. 3C.

The measurement protocol may comprise information on the individual test positions of the device under test 12, e.g. the respective location of the contact points 20. The measurement protocol may also comprise relevant test criteria for the individual test positions of the device under test 12, e.g. reference measurement values for measurements at the test positions. The measurement protocol may further comprise a test sequence for the test positions, wherein the test sequence defines the order in which the individual test positions are to be probed.

The respective test positions to be probed are checked automatically once a respective measurement has been performed by the probe unit 16 which can be verified appropriately due to the image analysis module 24.

In some embodiments, the user may load the measurement protocol and follows the instructions (provided by a wizard) by contacting the defined contact points. The measurement device 14, for example the image analysis module 24, automatically identifies the respective contact point, performs the measurement, evaluates the result, and displays the next step to the user.

Steps S5 and S6 are performed automatically for the case that there is a match in the data set.

However, if there is no match in the data set, the at least one measurement parameter cannot be set automatically, and a corresponding message may be displayed on the display 30. Thus, the user may be asked by the displayed message to enter the at least one measurement parameter for the corresponding contact point 20 manually.

A corresponding new entry in the data set may be generated and stored in the memory (step S7). The new entry comprises the captured image, the at least one characteristic quantity associated with the image and/or the at least one measurement parameter entered by the user.

Afterwards, the measurement may be automatically performed based on the at least one measurement parameter entered by the user. This may be done to optimize image recognition since all images assigned to a respective contact point are stored and used in the next comparison. If a contact point should not be recognized automatically, the corresponding image can be assigned manually to improve future image recognition.

In addition, the user can provide a marking, for instance a small sticker, with at least one code to assist recognition. The code may correspond to a serial code, a barcode, and/or a QR code as shown in FIG. 3C. Such marking can also be printed during the production of the device under test 12.

Generally, the image recognition can include a character recognition process to evaluate the respective marking(s).

Further imprints on the device under test 12 (e.g. serial numbers as barcodes or digits) can be recorded and documented appropriately.

Summarizing, the measurement system 10 described above supports the user in measurements on the real device under test 12 by automatically recognizing the test position of the probe unit 16 based on an image analysis technique. The measurement parameters associated with that particular test position are automatically set and the measurement is automatically performed.

Figure 3D:
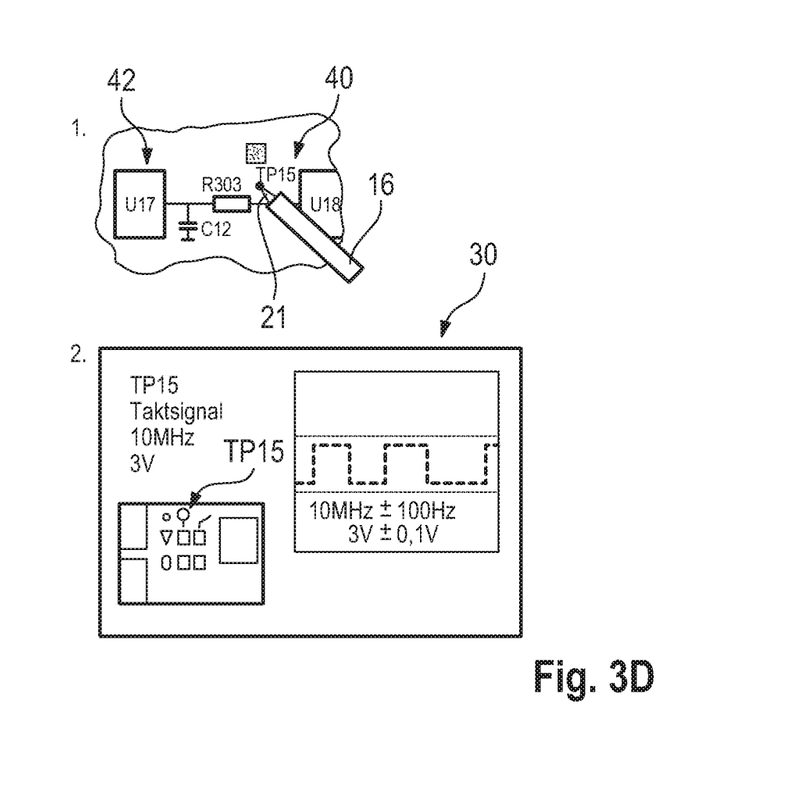

However, it is also conceivable that the probe unit 16 is positioned over a circuit diagram 42 of the device under test 12 or over a picture of the device under test. The circuit diagram 42 may be printed in a manual. A respective example is illustrated in FIG. 3D.

Accordingly, the measurement area 40 is a virtual measurement area, i.e. a portion of the circuit diagram 42 and/or a portion of the picture of the device under test 12. For example, the circuit diagram 42 and/or the picture of the device under test 12 may be printed in a manual of the device under test 12.

The steps of the method described above may analogously be performed based on this virtual measurement area, of course except for the step of performing the actual measurement. In some embodiments, information on a virtual test position of the probe unit 16 may be obtained by analyzing at least one captured image of the virtual measurement area.

Thus, the image analysis module 24 may automatically recognize at least one virtual contact point in the virtual measurement area. Therein, the virtual contact point in the virtual measurement area corresponds to one of the contact points 20 to be probed that is associated with the real device under test 12.

Information on the virtual contact point and/or the (real) contact point to be proved may be displayed on the display 30 of the measurement device 14. For this purpose, a representation of the device under test 12 may be displayed that illustrates the real appearance of the device under test 12 such that the user can easily understand where a component illustrated in the circuit diagram 42 is located on the real device under test 12.

This is particularly useful during training of a user, as the user may practice correctly identifying the contact points 20 of the real device under test 12 based on the circuit diagram 42 of the device under test 12 and/or based on the picture of the device under test 12.

In some embodiments, a location of the real contact point 20 corresponding to the virtual contact point in the virtual measurement area may be determined automatically. The location of the real contact point in the device under test 12 may be displayed on the display 30 of the measurement device 14.

Optionally, a simulated measurement value that is associated with the virtual contact point may be generated and displayed on the display 30. In other words, the real measurement is simulated. The simulated measurement value may comprise a predefined error, such that a user can be trained in identifying such errors. This is also shown in FIG. 3D.

Thus, the user is assisted in performing the subsequent real measurements by displaying information on the virtual contact point or rather the associated actual contact point 20, wherein the information is gathered based on an image analysis of the virtual measurement area.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system, comprising:
a measurement device
comprising an image analysis circuit; and
a probe unit comprising a probe tip and at least two image sensors, wherein said at least two image sensors are connected to said image analysis circuit in a signal transmitting manner, said at least two image sensors being configured to capture an image of a measurement area being associated with a device under test, respectively;
said image analysis circuit being configured to analyze said images captured and to determine at least one characteristic quantity of said images captured via an image analysis technique, wherein said image analysis circuit is further configured to gather an information concerning a test position of said probe unit from said at least one characteristic quantity wherein the test position is the location to which the probe tip of the probe unit is moved manually by a user in order to perform a measurement,
said image analysis circuit further being configured to determine at least one of a current location of the probe unit relative to the test position, an orientation of the probe unit relative to the test position, or a distance of the probe unit from the test position;
a memory;
a data set stored in said memory, said data set comprising information on properties of said device under test, wherein said data set comprises a three-dimensional model of at least a portion of said device under test;
wherein the image analysis circuit is configured to determine three-dimensional image data based on the images captured by the at least two image sensors, and wherein the image analysis circuit is configured to compare the three-dimensional image data with the three-dimensional model so as to gather the information concerning the test position of the probe unit; and
a display configured to display the at least one of the current location of the probe unit relative to the test position, the orientation of the probe unit relative to the test position, or the distance of the probe unit from the test position, such that the user can move the probe unit until the correct test position is reached,
wherein said measurement system is configured to automatically adapt properties of an electrical signal that is provided to said device under test via said probe unit for performing said measurement based on said at least one characteristic quantity.

2. The measurement system of claim 1, wherein said at least one characteristic quantity comprises at least one of a shape, a geometrical pattern, a color pattern, and an object class.

3. The measurement system of claim 1, further comprising a measurement circuit, said measurement circuit being configured to at least one of adapt at least one measurement parameter of said measurement device and to perform a measurement automatically based on said at least one characteristic quantity determined.

4. The measurement system of claim 3, wherein said image sensor and said measurement circuit are configured to capture said image together with at least one measurement value obtained.

5. The measurement system of claim 1, wherein said image analysis circuit is configured to determine at least one of a location of said probe unit and a position of said probe unit based on said image.

6. The measurement system of claim 5, wherein said image analysis circuit is configured to determine at least one of a location of said probe unit relative to a test point and a position of said probe unit relative to said test point based on said image.

7. The measurement system of claim 1, wherein said data set comprises a measurement protocol for said device under test.

8. The measurement system of claim 1, wherein said display is configured to display at least said test position.

9. A method for operating a measurement system, said measurement system comprising a probe unit a measurement device with an image analysis circuit, and a memory, said probe unit comprising a probe tip and at least two image sensors, said method comprising:
capturing an image of a measurement area being associated with a device under test by said at least two image sensors, respectively;
analyzing said images captured by said image analysis circuit;
determining at least one characteristic quantity of said images;
gathering an information concerning a test position of said probe unit from said at least one characteristic quantity by said image analysis circuit, wherein the test position is the location to which the probe tip of the probe unit is moved manually by a user in order to perform a measurement, wherein a data set comprising information on properties of said device under test is stored in said memory, and wherein said data set comprises a three-dimensional model of at least a portion of said device under test,
said gathering an information concerning a test position of said probe unit from said at least one characteristic quantity by said image analysis circuit includes determining, by the image analysis circuit, three-dimensional image data based on the images captured by the at least two image sensors and comparing the three-dimensional image data with the three-dimensional model;
determining, by the image analysis circuit, at least one of a current location of the probe unit relative to the test position, an orientation of the probe unit relative to the test position, or a distance of the probe unit from the test position; and
displaying, by a display, the at least one of the current location of the probe unit relative to the test position, the orientation of the probe unit relative to the test position, or the distance of the probe unit from the test position, such that a user can move the probe unit until the correct test position is reached.

10. The method of claim 9, wherein said at least one characteristic quantity comprises at least one of a shape, a geometrical pattern, a color pattern and an object class.

11. The method of claim 9, wherein at least one measurement parameter of said measurement device is adapted based on said at least one characteristic quantity.

12. The method of claim 9, wherein at least one of a location of said probe unit and a position of said probe unit is determined based on said image.

13. The method of claim 12, wherein at least one of a location of said probe unit relative to a test point and a position of said probe unit relative to said test point is determined based on said image.

14. A measurement system, said measurement system comprising a measurement device and a probe unit,
said measurement device comprising an image analysis circuit;
said probe unit comprising a probe tip and at least two image sensors, wherein said at least two image sensors are connected to said image analysis circuit in a signal transmitting manner,
said at least two image sensors being configured to capture an image of a measurement area being associated with a device under test respectively; and
said image analysis circuit being configured to analyze said images captured and to determine at least one characteristic quantity of said images captured via an image analysis technique, wherein said image analysis circuit is further configured to gather an information concerning a test position of said probe unit from said at least one characteristic quantity, wherein the test position is the location to which the probe tip of the probe unit has to be moved manually by a user in order to perform a measurement,
wherein said at least one characteristic quantity comprises an object class, wherein said object class is associated with a type of contact point for said probe unit in said device under test and/or with a type of circuitry of said device under test;
a memory;
a data set stored in said memory, said data set comprising information on properties of said device under test, wherein said data set comprises a three-dimensional model of at least a portion of said device under test;
wherein the image analysis circuit is configured to determine three-dimensional image data based on the images captured by the at least two image sensors, and wherein the image analysis circuit is configured to compare the three-dimensional image data with the three-dimensional model so as to gather the information concerning the test position of the probe unit; and
a measurement circuit configured to at least one of adapt at least one measurement parameter of said measurement device or perform a measurement automatically based on said at least one characteristic quantity determined, such that the at least one measurement parameter of said measurement device is adapted based on said object class and/or said measurement is performed automatically based on said object class.

* * * * *